United States Patent
Funakoshi (10) Patent No.: US 7,885,789 B2
(45) Date of Patent: Feb. 8, 2011

(54) RECIPE PARAMETER MANAGEMENT SYSTEM AND RECIPE PARAMETER MANAGEMENT METHOD

(75) Inventor: Tomohiro Funakoshi, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 12/430,701

(22) Filed: Apr. 27, 2009

(65) Prior Publication Data

US 2009/0281755 A1 Nov. 12, 2009

(30) Foreign Application Priority Data

May 8, 2008 (JP) ............... 2008-122657

(51) Int. Cl.
G06F 17/18 (2006.01)
G06F 11/30 (2006.01)
G21C 17/00 (2006.01)

(52) U.S. Cl. ...................... 702/180; 702/185

(58) Field of Classification Search ............. 702/34, 702/35, 67, 180, 183, 185; 700/121; 382/149; 345/442

See application file for complete search history.

(56) References Cited

U.S. PATENT DOCUMENTS

| | | | | |
|---|---|---|---|---|
| 6,430,572 | B1 * | 8/2002 | Steffan et al. | ............. 707/104.1 |
| 2003/0058444 | A1 * | 3/2003 | Nara et al. | .................. 356/394 |
| 2005/0218325 | A1 | 10/2005 | Nishiyama et al. | |
| 2006/0111879 | A1 | 5/2006 | Funakoshi | |
| 2007/0024963 | A1 * | 2/2007 | Maedo et al. | ................ 359/368 |
| 2007/0031026 | A1 | 2/2007 | Kurihara et al. | |
| 2007/0067134 | A1 * | 3/2007 | Borowicz et al. | ........... 702/127 |
| 2007/0145270 | A1 | 6/2007 | Miyamoto et al. | |
| 2008/0123936 | A1 | 5/2008 | Funakoshi | .................. 382/149 |
| 2008/0147228 | A1 * | 6/2008 | Fenner et al. | ............... 700/121 |
| 2008/0226153 | A1 * | 9/2008 | Ono et al. | ................... 382/141 |
| 2009/0030867 | A1 * | 1/2009 | Hirai et al. | .................... 706/50 |
| 2009/0088997 | A1 * | 4/2009 | Kikuchi et al. | ................ 702/81 |

FOREIGN PATENT DOCUMENTS

| | | |
|---|---|---|
| JP | 2005-292076 A | 10/2005 |
| JP | 2006-173589 A | 6/2006 |
| JP | 2007-40910 A | 2/2007 |
| JP | 2007-184565 A | 7/2007 |

* cited by examiner

Primary Examiner—Michael P Nghiem
(74) Attorney, Agent, or Firm—Miles & Stockbridge P.C.

(57) ABSTRACT

In operation to obtain an optimal observation condition in a review system, the number of trial reviews can be reduced to improve efficiency of the operation. For a defect review conducted by the review system, a recipe parameter management system stores, as recipe parameter setting history in a recipe parameter setting history database (DB), a recipe parameter setting values of recipe parameters set when the defect review is conducted, the number of trial reviews carried out until the recipe parameter setting values are set, and defect images obtained when the defect review is conducted. The apparatus displays, on a terminal, histograms and the numbers of trial reviews generated based on the recipe parameter setting history data stored in the recipe parameter setting history database (DB). Hence, the operator can easily obtain data regarding the recipe parameter setting in the past.

12 Claims, 12 Drawing Sheets

(RECIPE PARAMETER SETTING HISTORY DATA)

| PROCESS STEP NAME | ETCHING | | |
|---|---|---|---|
| RECIPE NAME | ECH001 | | |
| DAY AND TIME | 080331-13:30 | | |
| PARAMETER TYPE | PARAMETER NAME | PARAMETER VALUE | EDIT FREQUENCY |
| FOCUS CONDITION | FOCUS SENSITIVITY | fa | 10 |
| | | | |
| BEAM CONDITION | BEAM CURRENT | Ib | 1 |
| IMAGE DATA | | | |

RECIPE PARAMETER MANAGEMENT SYSTEM AND RECIPE PARAMETER MANAGEMENT METHOD

INCORPORATION BY REFERENCE

The present application claims priority from Japanese applications JP 2008-122657 filed on May 8, 2008, the content of which is hereby incorporated by reference into this application.

BACKGROUND OF THE INVENTION

The present invention relates to a recipe parameter management system and a recipe parameter management method for use with the same for managing recipe parameters of a review system to observe a surface of a planar substrate such as a semiconductor wafer.

Foreign matters and defects taking place in a circuit pattern formed on a wafer surface in semiconductor manufacturing processes cause defects in the semiconductor products such as integrated circuits manufactured through the semiconductor manufacturing processes. To cope with the difficulty, whether or not a problem takes place in the manufacturing processes is continuously monitored by quantifying the state of occurrence of foreign matter and circuit pattern defects (to be referred to as wafer pattern defects hereinbelow) in a semiconductor manufacturing line. Also, by precisely observing the contour of a wafer pattern defect, whether or not the defect fatally affects the semiconductor product is also confirmed.

Conventionally, such defects have been visually observed by a human. Recently, by using apparatuses such as Automatic Defect Review (ADR) and Automatic Defect Classification (ADC) based on the image processing techniques employing a computer, it is possible to automatically determine the size, the contour, and the kind of the defects (reference is to be made to, for example, JP-A-2007-40910 and JP-A-2007-184565).

Since a large amount of defect data items can be obtained in a short period of time due to such automatizing functions, it is possible to efficiently narrow a range of, for example, the cause of defects. However, if the defect under consideration is a defect which fatally affects yield of the products, it is inevitable to rely on the visual inspection by a human in the final stage of confirmation of the defect. Hence, there still remain chances in which an engineer or operator observes defects by a review system and chances in which an engineer or operator checks images of defects automatically created by the review system.

On the other hand, in the review system, sensors are improved in their performance such as sensitivity thereof and various functions become increasingly complicated. As a result, load imposed on the engineer or the operator who operates the review system is not mitigated, but rather increased. To reduce the load, for example, JP-A-2006-173589 describes an example in which by effectively employing the Graphical User Interface (GUI), operability is improved in the operations ranging from the defect observation to the image collation which are repeatedly carried out in the defect analysis.

SUMMARY OF THE INVENTION

With recent development of functions and performance of the review system, the operation to determine an optimal review condition to review defects by the review system imposes heavy load on the engineer and the operator. However, in JP-A-2007-40910, JP-A-2007-184565, and JP-A-2006-173589, description has not been given of a method of efficiently determining the optimal review condition.

The operation to determine the optimal review condition is an operation to be first conducted when the review system is used. Ordinarily, the optimal review condition is obtained by conducting a trial review several times. The obtained condition is recorded as a so-called recipe parameter for each review target or each purpose. However, in the present stage of art, a technique to systematically utilize recipe parameters gathered in the past has not been established. Therefore, the operation efficiency in the obtaining the optimal review condition of the review system relies on skills and experiences of the engineer or the operator who operates the review system.

As the review system, a Scanning Electron Microscope (SEM) is used in many cases. In operation of the SEM, each time an observed image created by the SEM is obtained, surfaces of a semiconductor integrated circuit or the like as the review target are charged, and hence there remain SEM contamination marks. Hence, the number of trial reviews increases, and it becomes difficult to view the image of a defect to be inherently reviewed or the image cannot be viewed depending on cases. Therefore, it is desired to reduce the number of trial reviews in the operation to determine the optimal review condition.

It is therefore an object of the present invention, which has been devised in consideration of the above problem, to provide a recipe parameter management system and a recipe parameter management method in which in the operation to determine the optimal review condition, the number of trial reviews is reduced and the operation efficiency is improved.

In order to achieve the object according to the present invention, there is provided a recipe parameter management system which collects and manages data including setting values of recipe parameters during the defect review from the review system. The recipe parameter management system collects, as recipe parameter setting history data for the defect review conducted by the review system, data items including the setting values of recipe parameters set in the defect review, the number of trial reviews carried out to set the recipe parameters, and defect images of defects gathered in the defect review, and then stores the history data in a predetermined storage. On the basis of the recipe parameter setting history data stored in the storage, the recipe parameter management system generates a histogram for the recipe parameter setting values and displays the generated histogram and the number of trial reviews for each recipe parameter.

In short, when a defect review is carried out in the review system, the recipe parameter management system stores the recipe parameter setting values and the number of trial reviews in the storage such that when a defect review is next conducted, the management system displays the histogram of the setting values and the number of trial reviews for each recipe parameter. Hence, the engineer or operator conducting the defect review easily obtains the recipe parameter values set in the past defect reviews and can recognize a trend of difficulty of parameter setting for a recipe parameter under consideration on the basis of the histogram of setting values and the number of trial reviews for the pertinent recipe parameter.

According to the present invention, in the operation to determine an optimal review condition in the review system, the number of trial reviews can be reduced and hence efficiency of the operation is improved.

Other objects, features and advantages of the invention will become apparent from the following description of the embodiments of the invention taken in conjunction with the accompanying drawings.

DETAIL DESCRIPTION OF THE EMBODIMENTS

Referring now to the drawings, description will be given in detail of an embodiment of the present invention.

Figure 1:
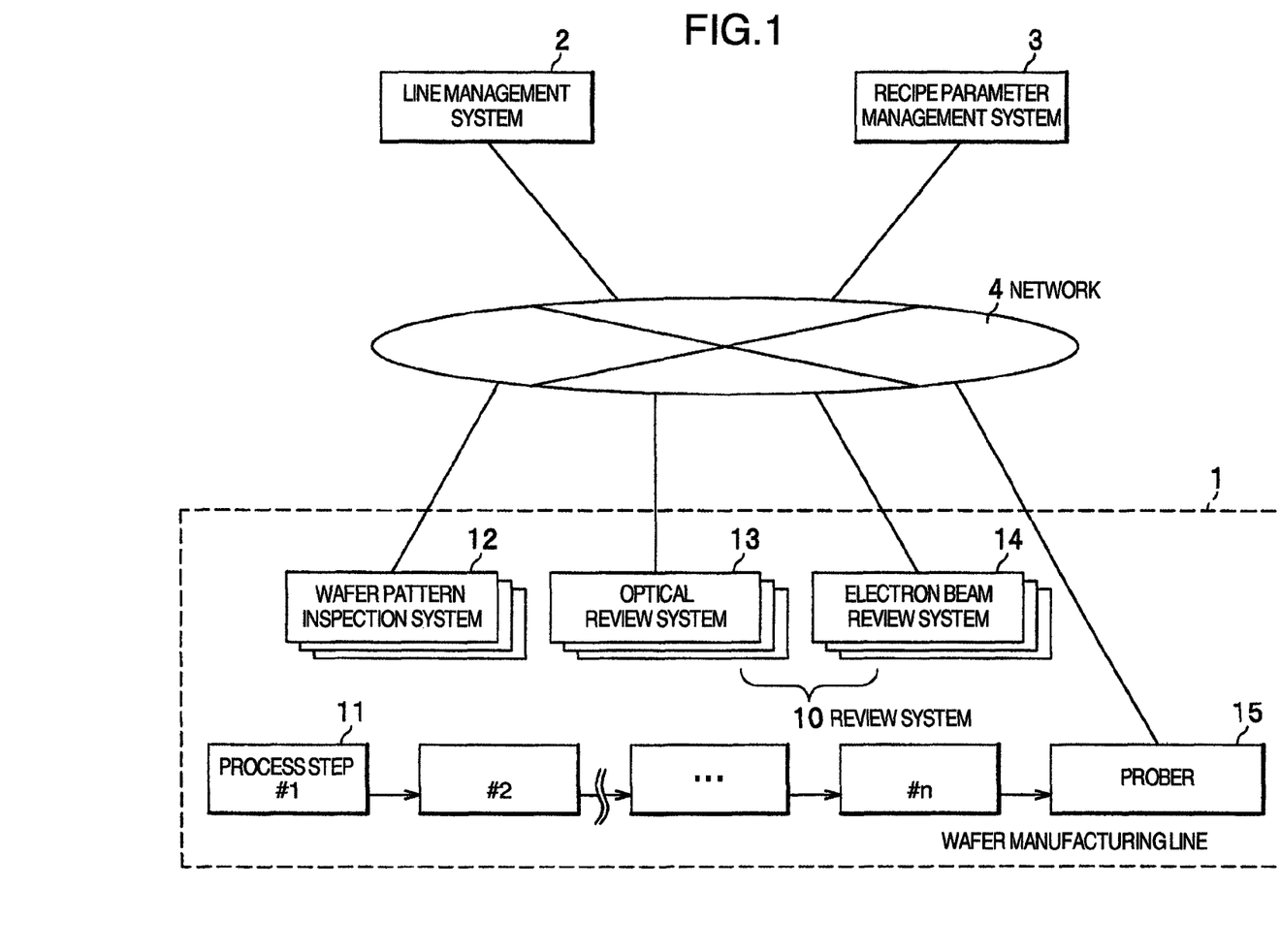
FIG. 1 is a block diagram showing an example of structure of an overall system to which an embodiment of a recipe parameter management system is applied according to the present invention.

FIG. 1 shows an example of structure of an overall system to which an embodiment of a recipe parameter management system is applied according to the present invention. As FIG. 1 shows, a recipe parameter management system 3 is employed, for example, to manage recipe parameters in a review system 10 arranged in a wafer manufacturing line 1.

The wafer manufacturing line 1 includes a plurality of process steps 11 disposed in a so-called clean room. In the process steps 11, patterns of devices and metal interconnections are sequentially formed on a silicon wafer to manufacture an integrated circuit or the like. There is disposed, after the last process step 11, a probe inspection system or prober 15 in which integrated circuits or the like formed on the wafer are electrically inspected to obtain quality control information such as production yield.

Each process step 11 includes, according to necessity, a wafer pattern inspection system 12, an optical review system 13, and an electron beam review system 14 (the systems 12 to 14 will be collectively referred to as a review system 10 hereinbelow). In the wafer pattern inspection system 12, foreign matter and defects appearing in each process step 11 are inspected and the number and size of the foreign matter pieces and those of the defects are obtained as quality control information of the process step 11. For example, if the obtained quality control information indicates an unacceptable condition for the process step 11, detailed states of foreign matter pieces and defects are observed by the review system 10 according to necessity.

In FIG. 1, a line management system 2 is connected via a network 4 including a Local Area Network (LAN) or the like to the wafer pattern inspection system 12, the review system 10, and the prober 15. The line management system 2 collects defect information of defects of wafers flowing through the process steps 11 from, for example, the wafer pattern inspection system 12, and manages the collected defect information. Specifically, from the wafer pattern inspection system 12, the line management system 2 collects defect information pieces such as a defect IDentifier (ID) of a defect detected by the wafer pattern inspection system 12, coordinates of a position of the defect, Realtime Defect Classification (RDC) information, an ADR image and the like, and then relates the defect information pieces to a lot number of a wafer under consideration, a wafer ID of the wafer, a die layout position, and the like. Further, the line management system 2 adds a process name and information of day and time of the associated inspection to the defect information pieces and stores the resultant information pieces in a database (DB), not shown, for management thereof.

The recipe parameter management system 3 is connected, like the line management system 2, via the network 4 to the wafer pattern inspection system 12, the review system 10, and the prober 15. Primarily, the recipe parameter management system 3 collects recipe parameter setting history data of the defect review conducted by the review system 10 and manages the collected data. Also, the management system 3 assists the operation which is conducted by the engineer or operator (to be simply referred to as an operator hereinbelow) to set optimal values of recipe parameters by using the review system 10.

When the defect review is conducted in the review system 10, the line management system 2 transmits defect information, which includes coordinates of a position of a defect and which is obtained from the wafer pattern inspection system 12, to the review system 10. However, since it is required to transmit quite a large amount of defect information pieces in ordinary cases, the defects are appropriately filtered according to, for example, a defect size and a coordinate position of the defect, and then defect information pieces obtained by filtering the defects are transmitted to the review system 10.

The review system 10 obtains detailed ADR images and detailed ADC information pieces for the defect associated with the received defect information. Further, according to indications from the operator, the review system 10 obtains images of defects and defect classification information to send the obtained defect images and the obtained defect classification information (including the ADR image and the ADC information in some cases) to the line management system 2. when the defect images and the defect classification information are received, the line management system 2 stores the defect images and the defect classification information in the database, not shown, with a relationship established to the defect information beforehand sent to the review system 10, for the management thereof.

Figure 2:
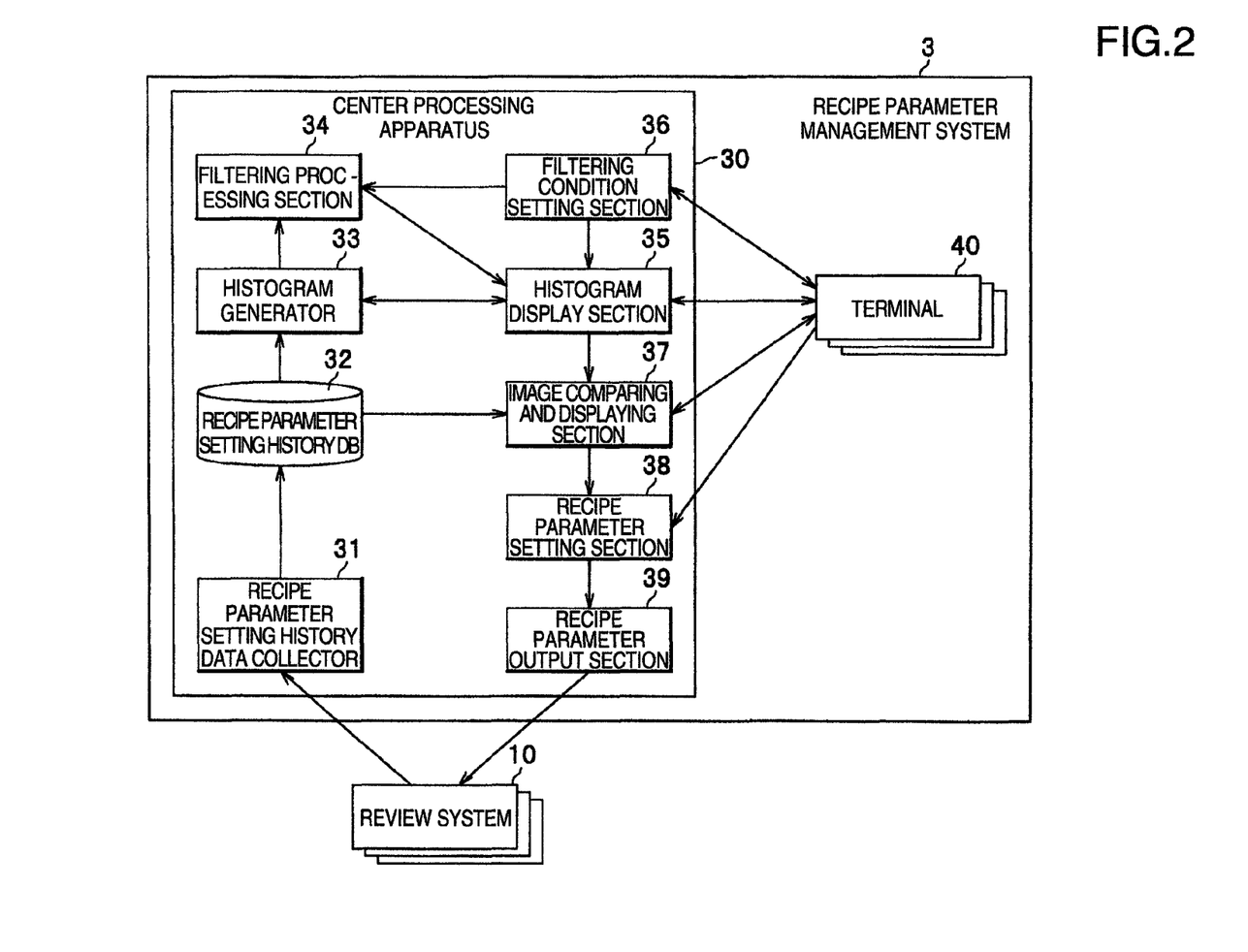
FIG. 2 is a block diagram showing an example of structure of functional blocks in an embodiment of a recipe parameter management system according to the present invention.

Description will now be given in detail of a configuration and a function of the recipe parameter management system 3 in the embodiment according to the present invention. FIG. 2 shows an example of a functional block configuration of the recipe parameter management system 3.

As FIG. 2 shows, the recipe parameter management system 3 includes a center processing apparatus 30 including a personal computer, a workstation, or the like, and terminal(s) 40 connected directly to or via a LAN, not shown, to the center processing apparatus 30. Moreover, the recipe parameter management system 3 is coupled via the network 4 with the review system 10 (FIG. 1).

The terminal 40 may be a terminal of any kind only if it includes a communication function to communicate with the center processing apparatus 30, a display, and an input unit including a mouse, keyboard, and the like. For example, the computer employed for operations and display in the review system 10 may be adopted as the terminal 40.

As FIG. 2 shows, the center processing apparatus 30 includes functional blocks, i.e., a recipe parameter setting history data collector 31, a recipe parameter setting history DB 32, a histogram generator 33, a filtering processing section 34, a histogram display section 35, a filtering condition setting section 36, an image comparing and displaying section 37, a recipe parameter setting section 38, and a recipe parameter output section 39. Each function of these functional blocks is implemented when a Central Processing Unit (CPU), not shown, of the center processing apparatus 30 executes a predetermined program stored in a storage (a Random Access Memory (RAM), a hard disk, or the like), not shown.

In FIG. 2, the recipe parameter setting history data collector 31 receives recipe parameter setting history data sent from the review system 10 to store the received data in the recipe parameter setting history DB 32. The other functional blocks of the center processing apparatus 30 will be described in conjunction with FIG. 4 and subsequent drawings.

Figure 3:
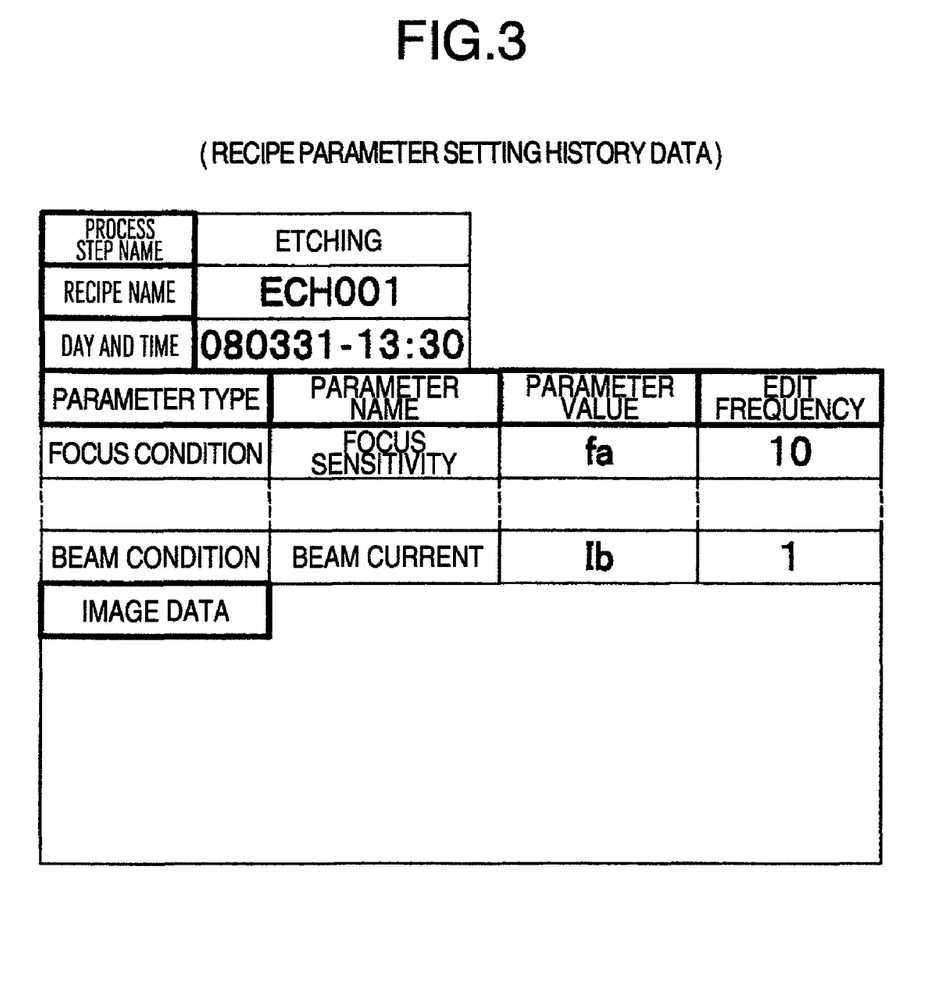
FIG. 3 is a diagram showing a layout example of recipe parameter setting history data transmitted from a review system.

FIG. 3 shows an example of a layout of the recipe parameter setting history data sent from the review system 10. When a defect review is conducted in a review system 10, the recipe parameter setting history data is obtained as history data of recipe parameters finally set to the review system 10. The recipe parameter setting history data also includes image data of defects obtained in the defect review. That is, the recipe parameter setting history data is created each time a defect review is carried out.

Specifically, as FIG. 3 shows, the recipe parameter setting history data includes data items such as a process step name, a recipe name, day and time, a parameter type, a parameter name, a parameter value, an edit frequency, and image data. The process step name and the recipe name are used as information pieces to identify the purpose of the defect review and the review system 10 in which the defect review is conducted. The parameter type, the parameter name, and the parameter value are a set of data items corresponding to each recipe parameter. Hence, the number of these sets of data items is equal to that of the recipe parameters to be set to the review system 10 in which the defect review is carried out.

Among the set of data items, the parameter type and the parameter name are information pieces to identify a recipe parameter. Hence, these data items may be concatenated by a hyphen with each other to be treated as one information piece.

The edit frequency indicates the number of trial reviews which are repeatedly conducted in the review system 10 by changing the parameter value of the pertinent recipe parameter until the parameter value is finally determined for the recipe parameter. Hence, the edit frequency may be regarded as a value indicating the trial-and-error operations or difficulty imposed on the operator to determine the value for the recipe parameter.

The image data is data of defect images actually obtained by the review system 10 when the parameter values of the recipe parameter setting history data are set as recipe parameters in the review system 10.

The recipe parameter setting history data described above is text data excepting the field of image data. The field of image data includes data in the format of, for example, Joint Photographic Experts Group (JPEG).

Figure 4:
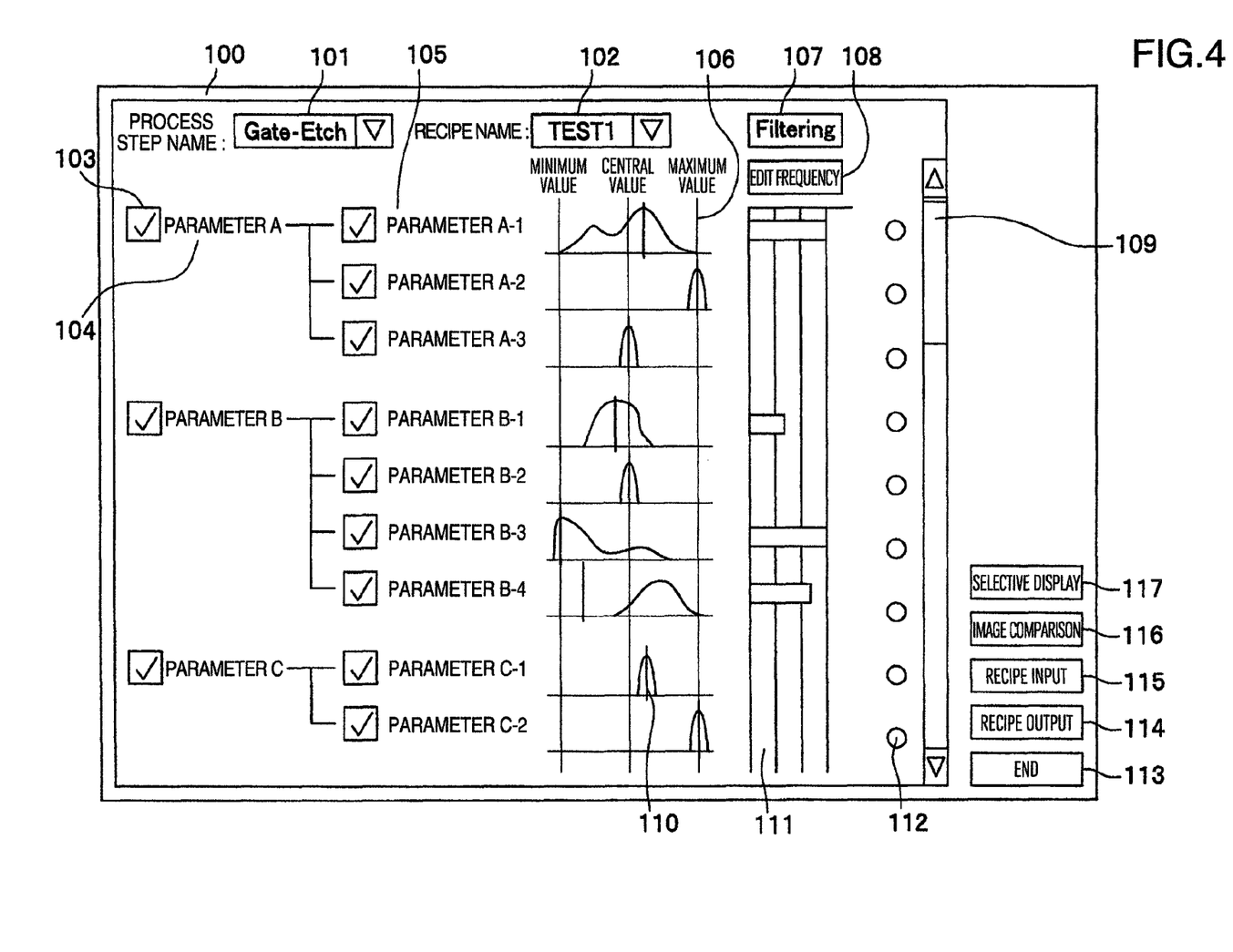
FIG. 4 is a diagram showing an example of a histogram display screen for recipe parameter setting values.

FIG. 4 shows an example of a histogram display screen of recipe parameter setting values. As FIG. 4 shows, for each recipe parameter designated by the parameter type 104 and the parameter name 105, the histogram display screen 100 displays a histogram 106 of setting values of the recipe parameter and a bar graph 111 of the edit frequency thereof. The center processing apparatus 30 displays the histogram display screen 100 for the processing of the histogram generator 33.

That is, when a histogram display request is received via the terminal 40, the center processing apparatus 30 first displays the process step name 101 and the recipe name 102 in the form of, for example, a pulldown menu. When a process step name and a recipe name are selected using the pulldown menu, the apparatus 30 extracts, from the recipe parameter setting history DB 32, recipe parameter setting history data having the selected process step name and the selected recipe name and then sorts the selected data using the parameter type 104 and the parameter name 105 as sorting keys.

Next, the center processing apparatus 30 generates, for the processing of the histogram generator 33, a histogram 106 using the recipe parameter setting values, i.e., parameter values of the recipe parameter setting history data sorted as above. Further, based on the edit frequency of the sorted recipe parameter setting history data, the apparatus 30 generates a bar graph 111 representing the edit frequency of the associated recipe parameters.

Subsequently, the center processing apparatus 30 displays, for the processing of the histogram display section 35, the histogram 106 of the recipe parameter setting values and the bar graph 111 of the edit frequency, which are generated as described above, on the terminal 40.

In the histogram display screen 100, the minimum, central, and maximum values displayed over the histogram 106 respectively indicate the minimum, central, and maximum values of the parameter value available in the review system 10. Incidentally, for convenience of display, these values are normalized as, for example, "central value=0", "maximum value=1", and "minimum value=−1".

It is assumed in the histogram display screen 100 that the histogram 106 and the bar graph 111 of the edit frequency are displayed for all recipe parameters specified by the parameter type 104 and the parameter name 105. However, if the histograms 106 and the bar graphs 111 overflow one screen image, the concealed section of the histograms 106 and that of the bar graphs 111 are displayed by the scroll display function through operation of a scroll bar 109.

The histogram 106 of recipe parameter setting values generated and displayed as above represents the distribution of frequency of parameter values set by many operators in the defect reviews conducted in the past. Hence, if a recipe parameter has a frequency distribution having a large variance (dispersion), it is implied that various values have been set to the recipe parameter and there exists difficulty in the setting of the parameter value. That is, in an operation to set the parameter value of a recipe parameter for which the frequency distribution of the parameter values has a large variance (dispersion), the operator is required to be carefully set the parameter value.

On the other hand, if a recipe parameter has a frequency distribution having a small variance (dispersion), the recipe parameter has the approximate same value in many past defect reviews. It is implied that the parameter value can be relatively easily set. It is predictable that no serious problem occurs even if an average value (or a value substantially equal to the average value) of the parameter values set in the past is employed in a defect review to be conducted.

Similarly, the bar graph 111 of the edit frequency created as above represents an average number of trial reviews carried out until the parameter value is determined for the associated recipe parameter in the past defect reviews. That is, if a recipe parameter has a large edit frequency, it is indicated that the trial review is conducted many times until the final parameter value is determined by the defect review and it is implied that the recipe parameter cannot be easily determined. Hence, the operator is required to carefully set the parameter value of the recipe parameter. Contrarily, if a recipe parameter has a small edit frequency, it can be considered that the parameter value is relatively easily set.

Furthermore, in FIG. 4, a parameter value setting cursor 110 is indicated by a vertical line in the histogram 106 of recipe parameter setting values. By moving the cursor 110 to the left or the right, the operator can appropriately designate a parameter value to be set.

That is, the center processing apparatus 30 reads, for the processing of the recipe parameter setting section 38, the position of the parameter value setting cursor 110 from the histogram 106 to determine the current recipe parameter value based on the position.

In the histogram display screen 100, check boxes 103 are displayed in front of the parameter type 104 and the parameter name 105 and a parameter selection button 112 is displayed for image comparison on the right-hand side of the bar graph 111 of the edit frequency. Also, to implement more precise functions, there are displayed a filtering button 107, an edit frequency button 108, a selection display button 117, an image comparison button 116, a recipe input button 115, a recipe output button 114, an end button 113 and the like.

The image comparison button 116 is used to select recipe parameters such that images are compared with each other according to values of the selected recipe parameters to be displayed on the screen. The selection display button 117 is employed to display only the histograms of the selected recipe parameters. The edit frequency button 108 is used to display the histograms 106 of the recipe parameters by sorting the histograms 106 in an order of the edit frequency. The filtering button 107 is used to display a histogram 106 for each recipe parameter selected according to a predetermined filtering condition. The recipe input button 115 is employed to obtain, from the review system 10, a parameter value of each recipe parameter set when a defect review is conducted in the review system 10. The recipe output button 114 is used to output, to the review system 10, recipe parameters set in the center processing apparatus 30. The end button 113 is used to close the histogram display screen 100. Description will now be given of examples of functions to be executed and examples of screens to be displayed when these buttons are clicked.

Figure 5:
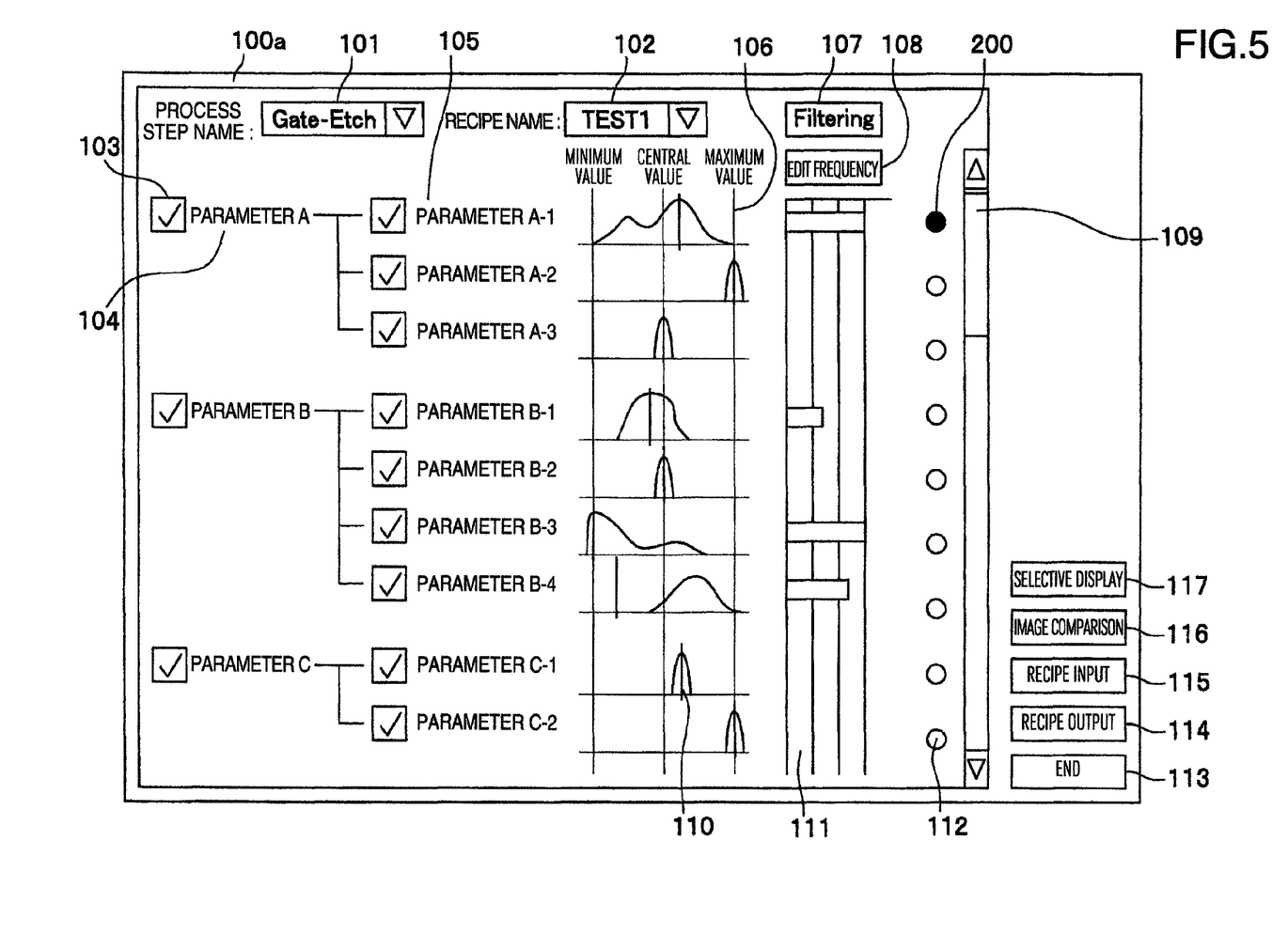
FIG. 5 is a diagram showing an example of a display screen indicating an operation in which one of the parameter selection buttons is selected in the histogram display screen of FIG. 4.
Figure 6:
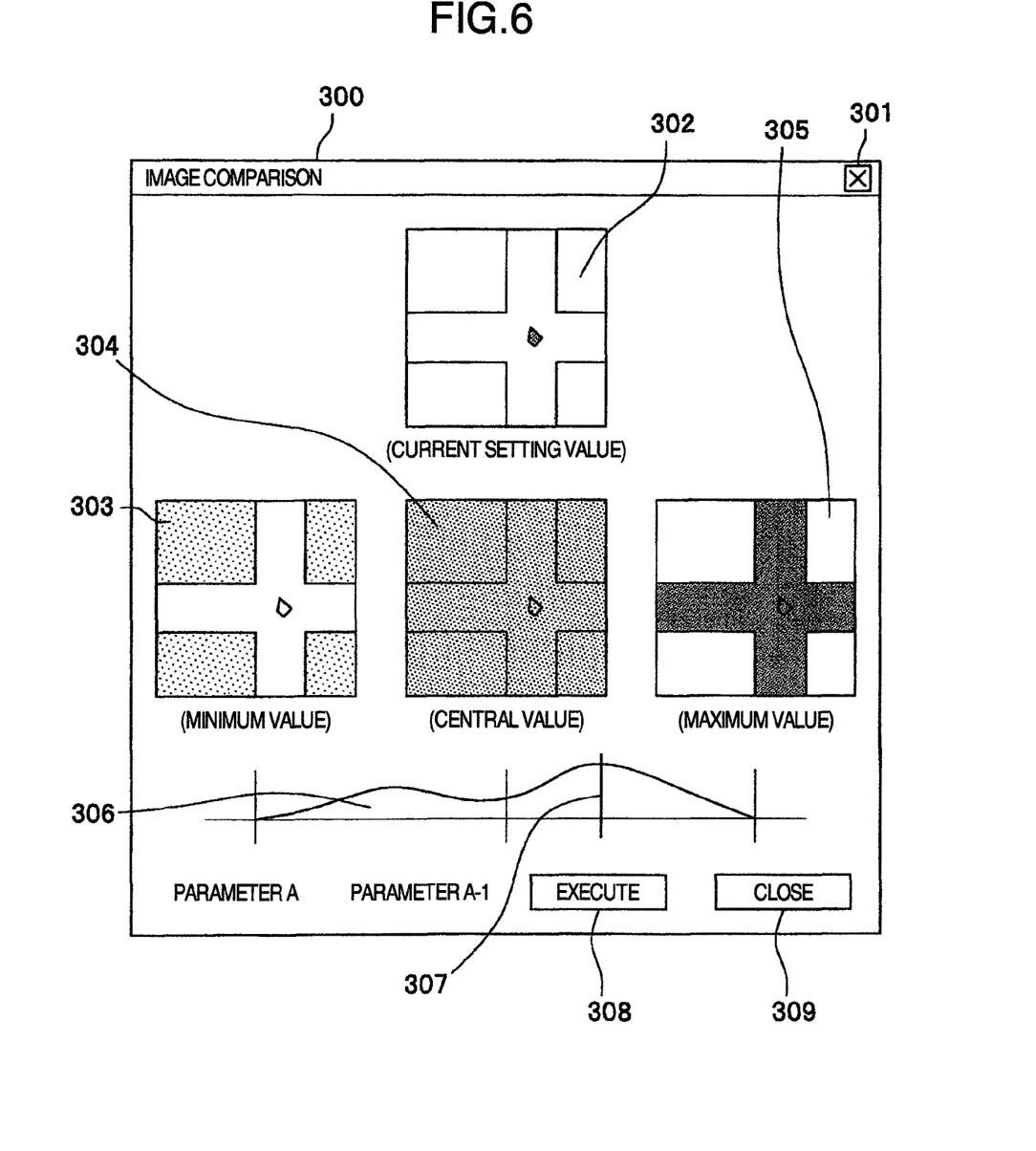
FIG. 6 is a diagram showing an example of an image comparison and display screen.

First, the image comparison and display function will be described by referring to FIGS. 5 and 6. FIG. 5 shows an example of the display screen indicating that one of the parameter selection buttons 112 is selected in the histogram display screen 100 of FIG. 4. FIG. 6 shows an example of the image comparison screen.

If one of the parameter selection buttons (radio buttons) 112 indicated by small white circles is selected and is then clicked in the screen 100 of FIG. 4, the selected white circle is changed to a black circle to resultantly display a histogram display screen 100a as shown in FIG. 5. In the screen 100a, the black circle of the parameter selection button 200 indicates that a recipe parameter for which the parameter type is "parameter A" and the parameter name is "parameter A-1" has been selected as shown in FIG. 6.

If the image comparison button 116 is clicked while the histogram display screen 100a is being displayed, the center processing apparatus 30 displays an image comparison screen 300 for the processing of the image comparison and displaying section 37.

That is, the center processing apparatus 30 opens a new image comparison screen 300 and displays a histogram 306 with respect to a recipe parameter for which the parameter type is "parameter A" and the parameter name is "parameter A-1". For each of the minimum, central, and maximum values of parameter values obtained from the histogram 306 (other than the minimum, central, and maximum values which can be set to the review system 10), the apparatus 30 displays in the screen 300 defect images 303, 304, and 305 which are obtained and stored in the recipe parameter setting history DB 32 in the past. In the histogram 306, a parameter value setting cursor 307 indicated by a vertical line is also displayed.

By moving the cursor 307 to the right or the left, the operator can appropriately set the parameter value of the associated recipe parameter. When the operator clicks an execute button 308 displayed in a bottom section of the screen 300, the center processing apparatus 30 extracts from the history DB 32 a defect image which is obtained using a parameter value most similar to the current parameter value of the recipe parameter and displays the extracted defect image as a defect image 302 of the current setting value in the image comparison screen 300.

Therefore, by setting various parameter values of the recipe parameter by use of the cursor 307 in the image comparison screen 300, the operator can easily confirm defect images which are obtained in the past and which correspond to the parameter values of the recipe parameter. Based on the defect images, the operator can easily determine an optimal value of the recipe parameter obtained in the past.

That is, the optimal value of the recipe parameter can be determined without conducting trial reviews in the review system 10 or the trial-and-error procedure is not required to determine the optimal value of the recipe parameter. Therefore, the number of trial reviews can be reduced.

According to the present embodiment, the condition to obtain the optimal recipe parameter can be more efficiently determined in the review system 10. If the review system 10 is an electron beam review system 14, it is possible that no contamination mark is or a reduced number of contamination marks are observed by the electro beam review system on a wafer as the review target.

In the image comparison screen 300 of FIG. 6, if a shut button 309 or a close button 301 is clicked, the screen 300 is closed.

Figure 7:
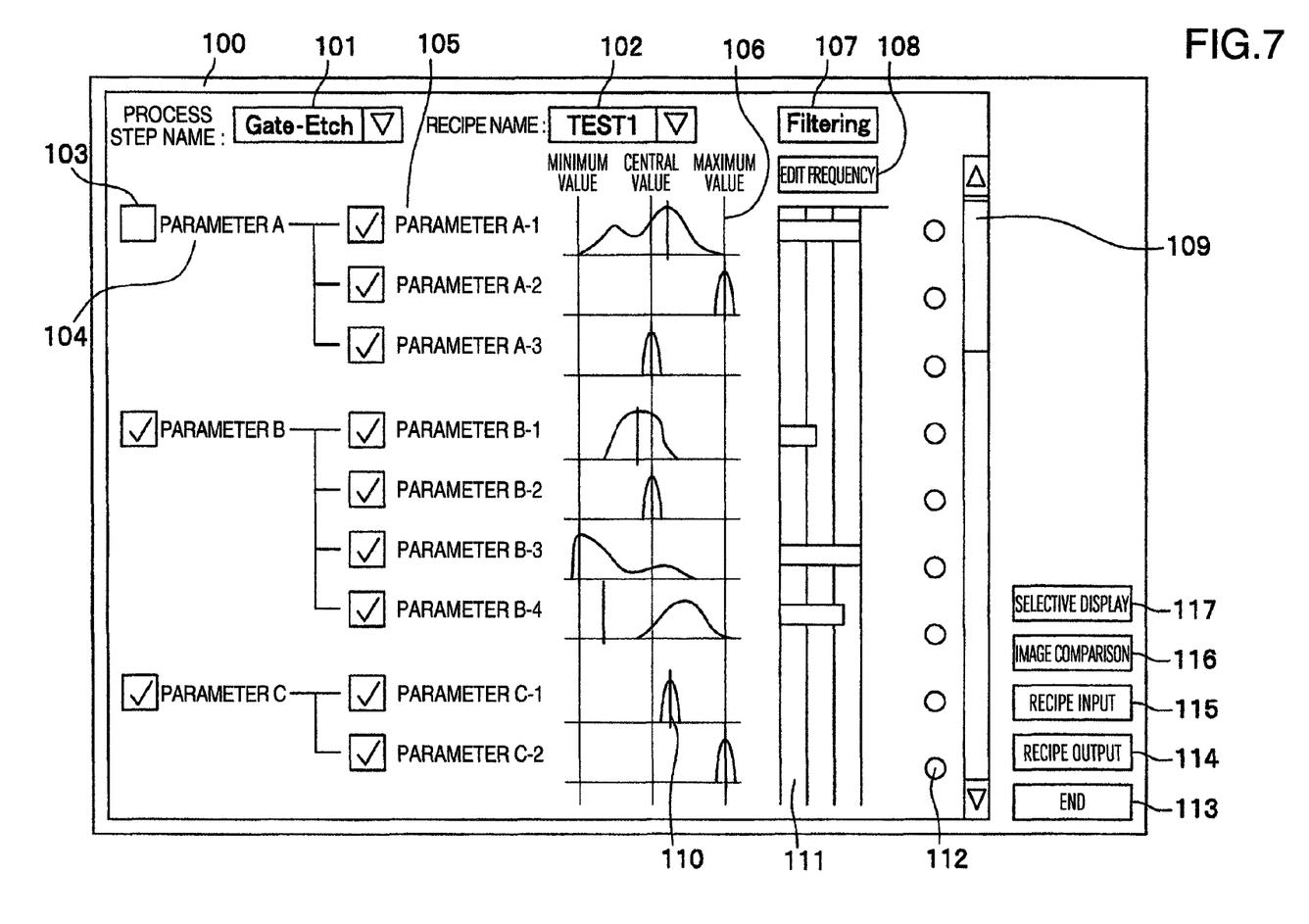
FIG. 7 is a diagram showing an example of a display screen indicating an operation in which the check mark is released from part of the check boxes in the histogram display screen of FIG. 4.
Figure 8:
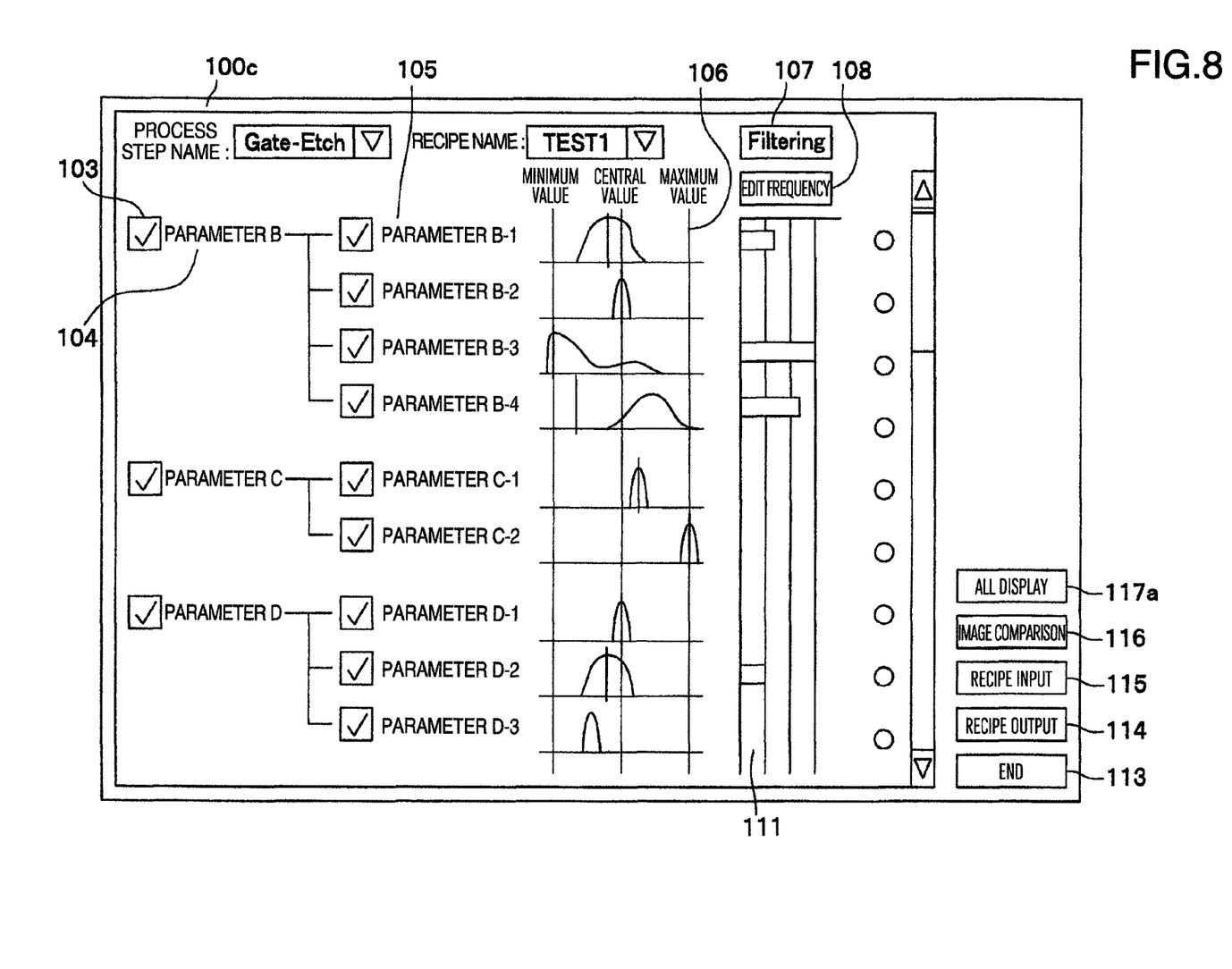
FIG. 8 is a diagram showing an example of a display screen displayed after the check mark is released from the check box.

Referring now to FIGS. 7 and 8, description will be given of the selection and display function of the histogram display. FIG. 7 shows an example of a display screen indicating that a check mark is removed from part of the check boxes in the histogram display screen 100 of FIG. 4. FIG. 8 shows an example of the histogram display screen after the check mark is removed.

In the example of the histogram display screen 100b of FIG. 7, no check mark is displayed in the check box 103 for which the parameter type 104 is "parameter A". In this situation, it is assumed that the check mark is removed from the check boxes 103 of all parameter names 105 belonging to the parameter type 104.

In FIG. 7, when a check mark is inputted to the check boxes 103 on the left side of a parameter type 104 and an associated parameter name 105, a histogram 106 and a bar graph 111 of the edit frequency are displayed for a recipe parameter designated by the parameter type 104 and the parameter name 105. Hence, if the check mark is removed from one of the check boxes 103, the histogram 106 and the bar graph 111 are not displayed for the recipe parameter.

In the histogram display screen 100b (FIG. 7) obtained by removing the check mark from the check box 103 for which the parameter type 104 is "parameter A", if the selection and display button 117 is clicked, the center processing apparatus 30 displays a histogram display screen 100c as shown in FIG. 8. In the screen 100c, the system does not display the histogram 106 and the bar graph 111 for each recipe parameter belonging to "parameter A" for which the check mark is removed from the histogram display screen 100b of FIG. 7.

In the examples of FIGS. 7 and 8, when the check mark for "parameter A" is removed, the histogram 106 and the bar graph 111 are not displayed for each recipe parameter belonging to "parameter A". However, by removing the check mark on the left of the parameter name 105 without removing the check mark on the left of the parameter type 104, it is possible that the histogram 106 and the bar graph 111 are not displayed for each associated recipe parameter.

If an all display button 117a for reverse display, which is difference from the display button 117, is clicked in the histogram display screen 100c of FIG. 8, the screen display returns to the original histogram display screen 100 of FIG. 4.

Figure 9:
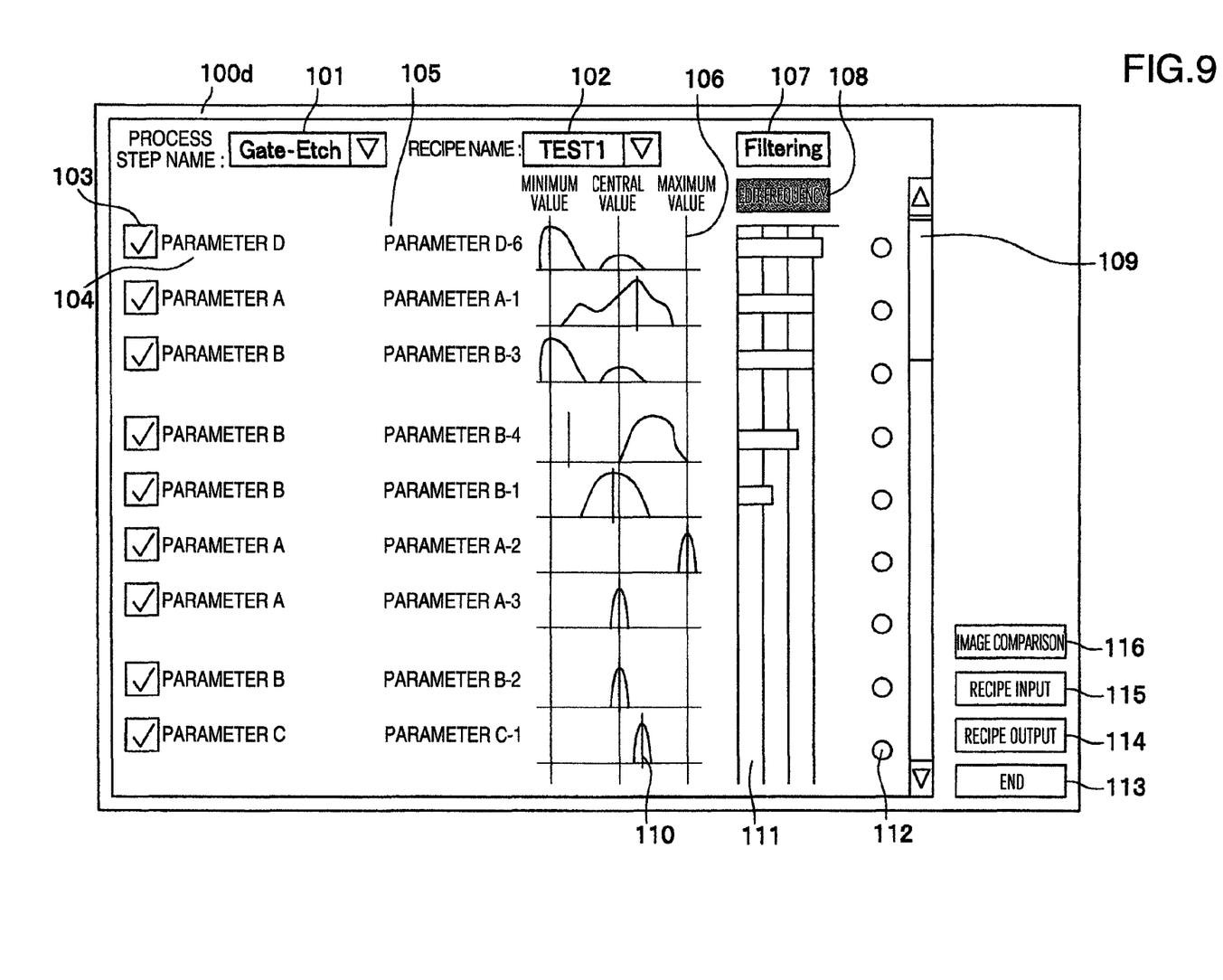
FIG. 9 is a diagram showing an example of a sorting and display screen resulted from a sorting operation conducted using the edit frequency as a sorting key.

Referring next to FIG. 9, description will be given of the sorting and display function using the edit frequency. FIG. 9 shows an example of a sorting and display screen generated according to the edit frequency. As FIG. 9 shows, the sorting and display screen 100d is produced by sorting data items displayed on the histogram display screen 100 of FIG. 4 in a descending order of the edit frequency.

Specifically, if the edit frequency button 108 is clicked in the histogram display screen 100 of FIG. 4, the histogram 106 and the bar graph 111 of the edit frequency of each recipe parameter displayed in the screen 100 are sorted in a descending order of the edit frequency and are displayed again.

As above, for a recipe parameter having a large edit frequency, an optimal value cannot be easily set and the operator is hence required to carefully set the value. In the sorting and display screen 100d, the histogram 106 and the bar graph 111 are displayed for each recipe parameter in the descending order of the edit frequency. Hence, only by viewing the screen 100d, the operator can easily recognize parameters to be carefully set.

If the edit frequency button 108 is clicked in the sorting and display screen 100d, the sorted display screen is released and the display returns to the original histogram display screen 100.

Figure 10:
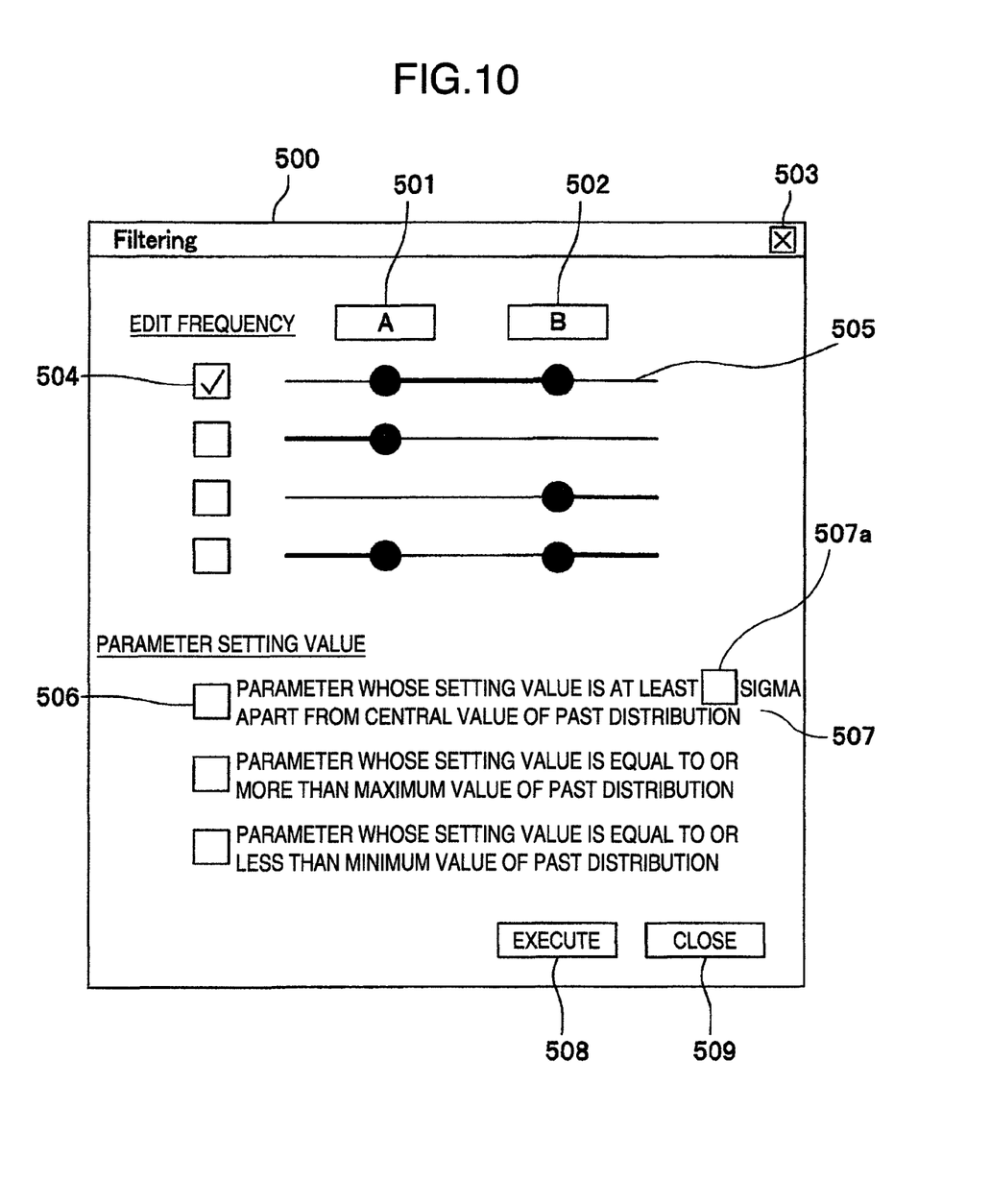
FIG. 10 is a diagram showing an example of a filtering condition setting screen.
Figure 11:
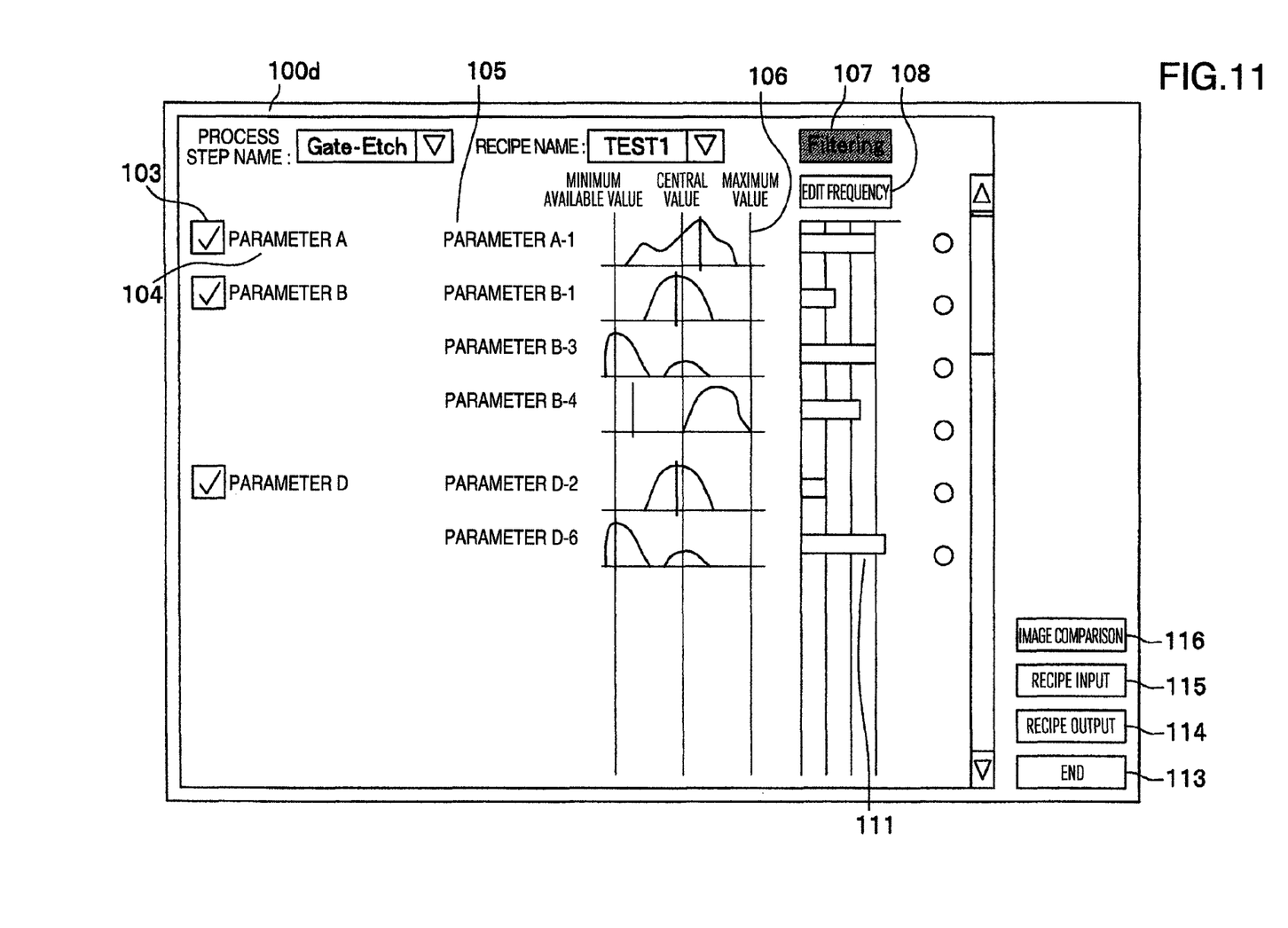
FIG. 11 is a diagram showing an example of a filtering and display screen.

Referring now to FIGS. 10 and 11, description will be given of the filtering and display function. FIG. 10 shows an example of a filtering condition setting screen and FIG. 11 shows an example of a filtering and display screen.

In the histogram display screen 100 of FIG. 4, if the filtering button 107 ("Filtering" in a frame 107 in FIG. 4 and in similar display screen examples) is clicked, the center processing apparatus 30 displays a filtering condition setting screen 500 of FIG. 10 for the processing of the filtering condition setting section 36. FIG. 10 shows two filtering conditions, i.e., a filtering condition based on the edit frequency and a filtering condition based on the parameter setting value.

Specifically, in the setting screen 500, to set a filtering condition based on the edit frequency, input boxes 501 and 502 to input condition values of the edit frequency and check boxes 504 to select associated filtering conditions 505 are displayed. Four filtering conditions 505 shown in FIG. 10 are (1) edit frequency is more than condition value A and less than condition value B, (2) edit frequency is equal to or less than condition A, (3) edit frequency is equal to or more than condition value B, and (4) edit frequency is equal to or less than condition A or is equal to or more than condition value B, in this order.

Also, in the filtering condition setting screen 500, to set a filter condition on the basis of a parameter setting value, filtering conditions 507 of associated parameter setting values and check boxes 506 to select the associated filtering conditions 507 are displayed.

In this connection, the parameter setting value is a value set by the parameter setting value cursor 110 in the histogram 106 displayed in the histogram display screen 100. In the filtering condition 507, "sigma" indicates the standard deviation obtained from the histogram of recipe parameter setting values, and a value indicating a multiple of the standard deviation is inputted to the input box 507a. Each filtering condition 507 in this example is a condition to extract a filtering condition for which an associated parameter setting value is remarkably apart from the parameter setting values set in the past.

In the filtering condition setting screen 500, if the execute button 508 is clicked after a check mark is inputted to one of the check boxes 504 to 506 and values are appropriately inputted to the input boxes 501, 502, and 507a for associated filtering condition values, the center processing apparatus 30 executes the processing of the filtering processing section 34 to display a filtering and display screen 100e as shown in FIG. 11. FIG. 11 shows an example of a display screen of histograms of recipe parameters after the filtering operation.

Specifically, the center processing apparatus 30 extracts from the histogram display screen 100 of FIG. 4 recipe parameters (each recipe parameter including a pair of a parameter type 104 and a parameter name 105) conforming to the filtering condition specified in the filtering condition setting screen 500 and displays a filtering display screen 100e including histograms 106 and bar graphs 111 of the edit frequency corresponding to the extracted recipe parameters (FIG. 11).

In the filtering condition setting screen 500, if a shut button 509 or a close button 503 is clicked, the screen 500 is closed. If the filtering button 107 is clicked while the filtering display screen 100e of FIG. 11 is displayed, the filtering is released and the display returns to the original histogram display screen 100.

Due to the filtering and display function, it is possible that recipe parameters which are to be carefully set can be effectively extracted to be displayed for the operator. This hence helps the operator easily obtain histograms 106 of setting values of recipe parameters.

In the histogram display screen 100 of FIG. 1 and the like, if the recipe output button 114 is clicked, the center processing apparatus 30 assumes, for the processing of the recipe parameter output section 39, that the values being currently set to recipe parameters are the optimal values of the recipe parameters and transmits the values to the review system 10.

The operator of the review system 10 regards the recipe parameter values received from the center processing apparatus 30 as the optimal recipe parameter values for which the conditions have been determined. The operator hence can start the defect review for an actual wafer and the like. Alternatively, the operator of the review system 10 may use the recipe parameter values from the apparatus 30 as initial values to resultantly obtain the optimal parameter conditions in the review system 10. In either cases, it is possible to reduce the number of trial reviews in the review system 10.

According to the present embodiment, in the recipe parameter management system 3, the operator can beforehand determine optimal recipe parameter conditions in an online fashion by use of the recipe parameters obtained in the past and associated defect images. Therefore, the number of trial reviews to be conducted in the review system 10 can be reduced. Resultantly, the operation to determine optimal recipe parameter conditions can be more efficiently carried out in the review system 10.

The operator can easily obtain the histogram of the recipe parameter setting history and the information of the number of setting changes of each recipe parameter in the past. Hence, it is possible for the operator to easily determine recipe parameters for which the optimal parameters are required to be carefully determined. As a result, even an unexperienced operator can conduct the operation to determine optimal recipe parameter conditions. Also, the optimal values determined by the respective operators for each recipe parameter less deviate from each other between the operators.

Therefore, the quality control and the defect analysis for wafers flowing through the wafer manufacturing line 1 can be efficiently carried out with high precision. This resultantly leads to improvement in yield of integrated circuits formed in wafers.

Description will now be supplementarily given of a variation of the embodiment. In this embodiment, the recipe parameter management system 3 conducts the operation to obtain the recipe parameter optimal values in an offline manner on the basis of defect images obtained in the past. However, the operation may be carried out in an online manner. In such case, it is assumed that the terminal 40 is integrally disposed in the review system 10 or is arranged quite near the review system 10. Also, for example, the defect image 302 of the current setting values in the image comparison screen 300 (FIG. 6) is not extracted from the recipe parameter setting history DB 32, but an image actually obtained by the review system 10 is displayed as the defect image 302. Hence, the recipe parameter optimal values can be determined at a higher speed.

Figure 12:
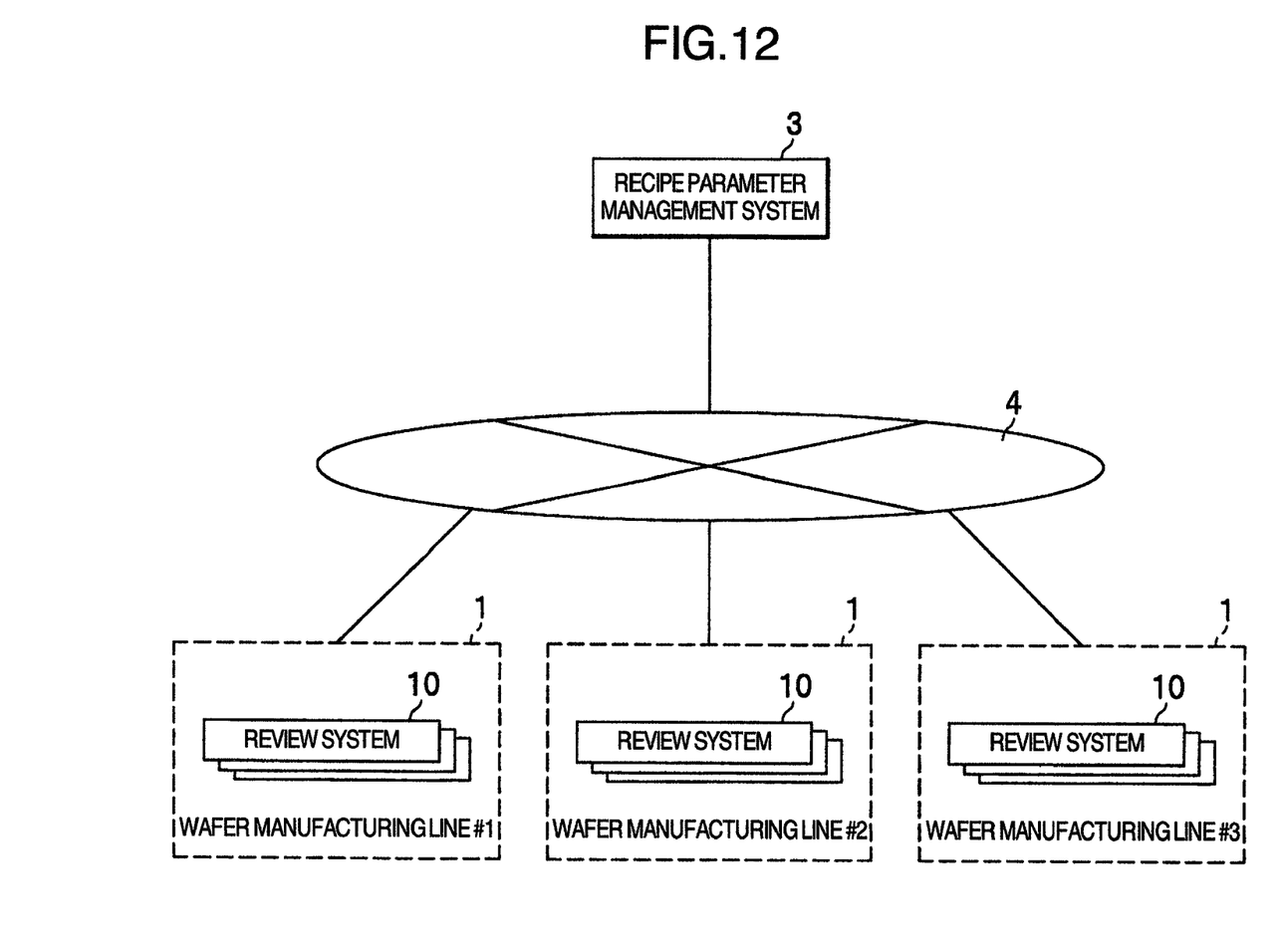
FIG. 12 is a block diagram showing an example of another configuration of an overall system to which an embodiment of a recipe parameter management system is applied according to the present invention.

As shown in FIG. 12, the recipe parameter management system 3 may be linked via the network 4 with the review systems 10 respectively set in a plurality of wafer manufacturing lines 1. In such situation, a larger amount of recipe parameter setting history information pieces are gathered in the recipe parameter setting history DB 32 of the management system 3. It is hence possible to determine optimal recipe parameter values with higher precision.

In the embodiment, the defect review is conducted for silicon wafers in intermediate process steps to form integrated circuits and the like. However, the defect review may also be carried out for a liquid-crystal display substrate, an organic Electro-Luminescence display substrate, a magnetic disk substrate, and the like in intermediate process steps of production thereof.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A recipe parameter management system for collecting, from a review system, data including recipe parameter setting values of recipe parameters when a defect review is conducted, and managing the data, comprising:
    a collecting unit for collecting from the review system, as recipe parameter setting history data, data including the recipe parameter setting values set to the review system when the defect review is conducted, numbers of trial reviews carried out until the recipe parameter setting values are set when the defect review is conducted, and defect images obtained when the defect review is conducted;
    a storage unit for storing therein the collected recipe parameter setting history data;
    a histogram generating unit for generating a histogram with respect to the recipe parameter setting values based on the recipe parameter setting values contained in the recipe parameter setting history data stored in the storage unit; and
    a display unit for displaying, for each recipe parameter, the histogram generated by the histogram generating unit and the numbers of trial reviews.

2. The recipe parameter management system according to claim 1, wherein the display unit extracts, from the storage unit, the defect images respectively corresponding to a minimum value, a central value, and a maximum value obtained from the histogram of the recipe parameter setting values and displays the defect images.

3. The recipe parameter management system according to claim 2, further comprising a setting unit for setting current setting values of the recipe parameters,
    wherein the display unit extracts, from the storage unit, defect images respectively corresponding to recipe parameter setting values nearest respectively to the current setting values set by the setting unit and displays those defect images.

4. The recipe parameter management system according to claim 1, wherein the display unit sorts the histogram of the recipe parameter setting values and the numbers of the trial reviews in a descending order of the numbers of the trial reviews and displays the histogram and the numbers of the trial reviews.

5. The recipe parameter management system according to claim 1, wherein
    the display unit displays a filtering condition setting screen to set a condition to conduct filtering and display, filters the histogram of the recipe parameter setting values and the numbers of the trial reviews according to the filtering condition set via the filtering condition setting screen, and displays the histogram of the recipe parameter setting values and the numbers of the trial reviews.

6. The recipe parameter management system according to claim 1, wherein the recipe parameter setting history data includes at least one data item selected from a group consisting of a process step name, a recipe name, a day and time, a parameter type, a parameter name, a parameter value, an edit frequency, and an image data.

7. A recipe parameter management method for a recipe parameter management system for collecting, from a review system, data including recipe parameter setting values of recipe parameters when a defect review is conducted, and managing the data, the method including using a computer system to perform the following steps:

collecting from the review system, as recipe parameter setting history data, data including the recipe parameter setting values set to the review system when the defect review is conducted, numbers of trial reviews carried out until the recipe parameter setting values are set when the defect review is conducted, and defect images obtained when the defect review is conducted;

storing, in a predetermined storage, the recipe parameter setting history data collected;

generating a histogram with respect to the recipe parameter setting values based on the recipe parameter setting values contained in the recipe parameter setting history data stored in the storage; and displaying, for each recipe parameter, the histogram generated and the numbers of trial reviews.

8. The recipe parameter management method according to claim 7, wherein the step of displaying further comprises the step of extracting, from the storage, the defect images respectively corresponding to a minimum value, a central value, and a maximum value obtained from the histogram of the recipe parameter setting values and displaying the defect images.

9. The recipe parameter management method according to claim 8, further comprising:

a step of setting current setting values of the recipe parameters, wherein the step of displaying further comprises a step of extracting, from the storage, defect images respectively corresponding to recipe parameter setting values nearest respectively to the current setting values set by the step of setting current setting values of the recipe parameters and displaying those defect images.

10. The recipe parameter management method according to claim 7, wherein the step of displaying further comprises the step of sorting the histogram of the recipe parameter setting values and the numbers of the trial reviews in a descending order of the numbers of the trial reviews and displaying the histogram and the numbers of the trial reviews.

11. The recipe parameter management method according to claim 7, wherein the step of displaying further comprises the steps of:

displaying a filtering condition setting screen to set a condition to conduct filtering and display;

filtering the histogram of the recipe parameter setting values and the numbers of the trial reviews according to the filtering condition set via the filtering condition setting screen; and displaying the histogram of the recipe parameter setting values and the numbers of the trial reviews.

12. The recipe parameter management method according to claim 7, wherein the recipe parameter setting history data includes at least one data item selected from a group consisting of a process step name, a recipe name, day and time, a parameter type, a parameter name, a parameter value, an edit frequency, and an image data.

* * * * *